US006420917B1

(12) United States Patent
Klemmer

(10) Patent No.: US 6,420,917 B1
(45) Date of Patent: Jul. 16, 2002

(54) PLL LOOP FILTER WITH SWITCHED-CAPACITOR RESISTOR

(75) Inventor: Nikolaus Klemmer, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/410,308

(22) Filed: Oct. 1, 1999

(51) Int. Cl.$^7$ ................................................ H03L 7/06
(52) U.S. Cl. ...................................... 327/156; 327/159
(58) Field of Search ................................. 327/141, 147, 327/148, 150, 155, 157, 159; 331/17; 375/374–376

(56) References Cited

U.S. PATENT DOCUMENTS

| 5,055,803 A | 10/1991 | Hietala | 331/17 |
| 5,774,023 A | * 6/1998 | Irwin | 327/157 |
| 5,942,949 A | * 8/1999 | Wilson et al. | 327/157 |
| 5,963,099 A | * 10/1999 | Nagoya et al. | 331/17 |

OTHER PUBLICATIONS

Matsuura Shoji; "PLL Circuit" *Patent Abstracts of Japan*, Publication No. 06291644, vol. 013, No. 023, Jan. 19, 1989.

Nishioka Akihiko, "Clock Extracting Circuit", *Patent Abstracts of Japan*, Publication No. 63227120, Sep. 21, 1988.

Asta, D., et al., "Analysis of a Hubrid Analog/Switched–Capacitor Phase–Locked Loop", *IEEE Transactions on Circuits and Systems*, vol. 37, No. 2, Feb. 1, 1990.

D. J. L. Lewis Shrewsbury, "Switched Capacitor Filters for PLL", *Electronic Engineering*, vol. 55, No. 677, May, 1983.

* cited by examiner

Primary Examiner—My-Trang Nu Ton
(74) Attorney, Agent, or Firm—Coats & Bennett, P.L.L.C.

(57) ABSTRACT

A phase-locked loop circuit having improved phase noise characteristics includes a voltage-controlled oscillator developing an oscillating output signal responsive to a voltage control input. A reference source provides a reference frequency signal. A phase detector is operatively connected to the voltage-controlled oscillator and the reference source developing an output proportional to a phase difference between the oscillating output signal and the reference frequency signal. A loop filter connects the phase detector output to the voltage control input. The loop filter includes a switched-capacitor equivalent resistor.

15 Claims, 3 Drawing Sheets

PLL LOOP FILTER WITH SWITCHED-CAPACITOR RESISTOR

FIELD OF THE INVENTION

This invention relates to phase-locked loop filter circuits and, more particularly, to a loop filter with a switched-capacitor resistor.

BACKGROUND OF THE INVENTION

Phase-locked loop circuits are commonly used in circuits that require generation of a high-frequency periodic signal with the frequency of the signal being an accurate multiple of the frequency of a very stable and low-noise reference frequency signal. Phase-locked loop circuits also find applications where the phase of the output signal has to track the phase of the reference signal, thus the name phase-locked loop.

Phase-locked loop circuits are used for generating local oscillator signals in radio receivers and transmitters. The local oscillator signal is used for channel selection and thus is a multiple of a stable, low-noise and often temperature-compensated reference signal generator. Phase-locked loop circuits are also used for clock recovery applications in digital communication systems, disk-drive read-channels and the like. Phase-locked loop circuits are also used in frequency modulators and in the de-modulation of frequency-modulated signals. An overview of typical applications is discussed in "Monolithic Phase-Locked Loops and Clock Recovery Circuits, Theory and Design", Behzad Razavi, IEEE Press, 1996.

A typical phase-locked loop circuit includes a loop filter connecting a phase detector to a voltage-controlled oscillator. The loop filter defines the dynamics of the phase-locking feedback loop such that certain stability criteria are fulfilled and the loop doesn't enter an oscillatory condition. In second and higher order phase-locked loop circuits, this stabilization is commonly achieved by inserting a resistor into the loop filter. The resistor generates thermal noise that amounts to a contribution to the phase noise spectrum of the phase-locked loop output signal. The loop filter resistor noise can dominate the overall phase noise in the neighborhood of the loop bandwidth.

The present invention is directed to overcoming one or more of the problems discussed above in a novel and simple manner.

SUMMARY OF THE INVENTION

In accordance with the invention there is provided a phase-locked loop circuit including a loop filter with a switched-capacitor resistor.

Broadly, there is disclosed herein a phase-locked loop circuit having improved phase noise characteristics including a voltage-controlled oscillator developing an oscillating output signal responsive to a voltage control input. A reference source provides a reference frequency signal. A phase detector is operatively connected to the voltage-controlled oscillator and the reference source developing an output proportional to a phase difference between the oscillating output signal and the reference frequency signal. A loop filter connects the phase detector output to the control voltage input. The loop filter includes a capacitor and a switching circuit. The switching circuit alternately connects the capacitor to the phase detector output and to ground.

It is a feature of the invention that the loop filter further comprises a second capacitor connected between the switching circuit and the phase detector output and optionally an additional capacitor connected between the phase detector output and ground.

It is another feature of the invention that the switching circuit comprises a first transistor connecting the capacitor to the phase detector output and a second transistor connecting the capacitor to ground. The switching circuit further comprises a non-overlapping clock generator circuit for controlling the first and second transistors. The clock generator circuit operates at a frequency above a loop bandwidth of the phase-locked loop circuit.

It is an additional feature of the invention that the phase detector comprises a phase frequency detector. The phase detector also includes a charge pump circuit and the loop filter converts current pulses from the charge pump circuit into a voltage at the voltage control input. The phase detector includes a pair of edge-triggered resettable flip-flops and the oscillating output signal and the reference frequency signal are clock signals for the flip-flops and the flip-flops drive the charge pump circuit.

It is yet another feature of the invention to provide dividers connecting the oscillating output signal and the reference frequency signal to the phase detector.

There is disclosed in accordance with another aspect of the invention a phase-locked loop circuit including a voltage-controlled oscillator developing an oscillating output signal responsive to a voltage control input. A reference source provides a reference frequency signal. A phase frequency detector is operatively connected to the voltage-controlled oscillator and the reference source developing an output having positive or negative current pulses having widths proportional to a phase difference between the oscillating output signal and the reference frequency signal. A loop filter connects the phase detector output to the voltage control input. The loop filter includes an integrator converting current pulses into a voltage at the voltage control input and comprising a capacitor and a switching circuit. The switching circuit alternately connects the capacitor to the phase detector output and to ground.

Further features and advantages of the invention will be readily apparent from the specification and from the drawings.

DETAILED DESCRIPTION OF THE INVENTION

Figure 1:
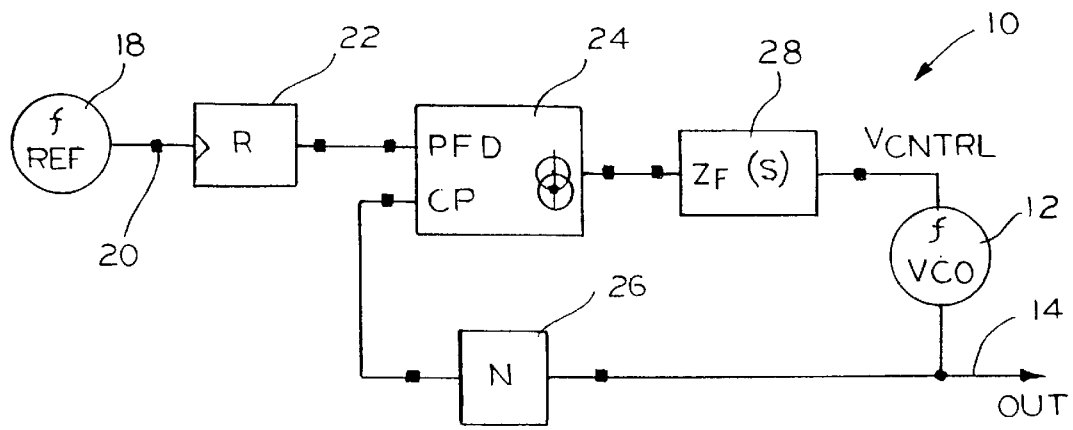
FIG. 1 is a block diagram of a phase-locked loop circuit.

Referring initially to FIG. 1, a typical implementation of a phase-locked loop circuit 10 may be used for generating local oscillator signals in a radio receiver or a transmitter, such as in cellular telephones. The circuit 10 includes a voltage-controlled oscillator (VCO) 12 developing an oscillating output signal on a line 14 responsive to a voltage control input on a line 16. A reference source 18 provides a reference frequency signal on a line 20. The reference frequency signal on the line 20 is coupled via a first divider 22 to one input of a phase detector 24. The oscillating output signal on the line 14 is connected through a second divider 26 to a second input of the phase detector 24. Particularly, the reference frequency signal is divided by a reference division ratio R. Similarly, the oscillating output signal is divided by a main division ratio N.

The phase detector 24 provides an output signal that is proportional to a phase difference of its two input signals. A loop filter 28 filters the phase detector output signal to develop the voltage control input on the line 16.

Figure 2:
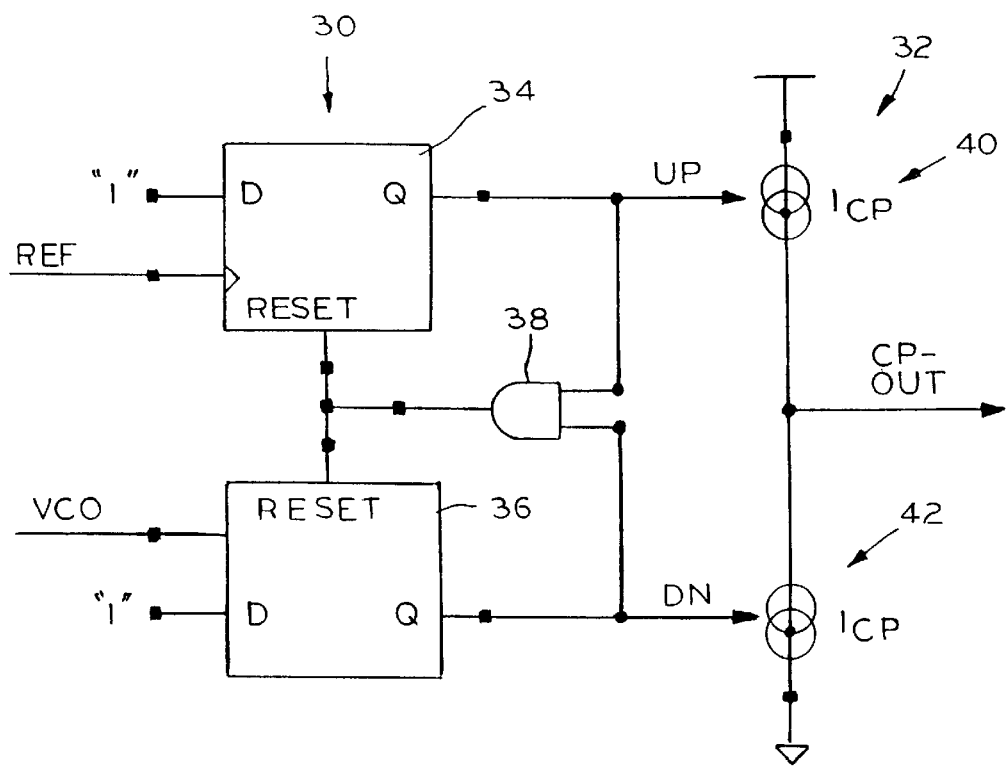
FIG. 2 is a block diagram of a phase frequency detector and charge pump circuit of the circuit of FIG. 1.

Depending on the circuit implementation, the phase detector 24 may comprise a phase-frequency detector. In the illustrated embodiment of the invention, the phase detector 24 comprises a combination of a phase frequency detector 30 and charge pump circuit 32, as illustrated in FIG. 2.

The phase frequency detector 32 is implemented as a digital circuit consisting of two edged-triggered resettable D-type flip-flops 34 and 36 with their D inputs connected to logical 1. The reference signal, labeled REF, from the divider 22 acts as the clock signal to the first flip-flop 34. The oscillating signal, labeled VCO, from the divider 26 acts as a clock signal to the second flip-flop 36. The output of the first flip-flop 34 comprises an "UP" output. The output of the second flip-flop 36 comprises a down or "DN" output. The outputs of the flip-flops 34 and 36 are also connected to the inputs of an AND gate 38. The output of the AND gate 38 is connected to the reset inputs of the flip-flops 34 and 36.

The operation of the pulse-frequency detector 30 is such that the UP output is set to logical 1 by the REF edge if it arrives prior to the VCO edge. The later VCO edge will reset the UP output back to logical 0. The DN output is set to logical 1 if the VCO edge arrives prior to the REF edge and is then reset to 0 by the later REF edge. Logical 1s on the UP and DN outputs enable the charge pump circuit 32, as described below, so that either positive or negative current pulses arrive at the charge pump output, labeled CPOUT. The width of these pulses is proportional to the phase difference of the REF and VCO signals.

The charge pump circuit 32 comprises first and second current reference sources 40 and 42 series connected between supply and ground. The first current source 40 is operated by the UP output. The second current source is operated by the DN output. The junction between the current sources 40 and 42 carries the charge pump output current, CPOUT.

The purpose of the phase-locked loop circuit 10 of FIG. 1 is to set the output frequency of the voltage-controlled oscillator 12 and achieve phase-lock with the reference signal from the source 18. In the implementation of the phase detector 24 of FIG. 1, the current pulses at the charge pump output need to be integrated and converted into a voltage that can be applied to the control voltage input of the oscillator 12. This conversion is implemented by the loop filter 28. In addition to functioning as an integrator, the loop filter 28 also determines the stability of the feedback loop.

Figure 3:
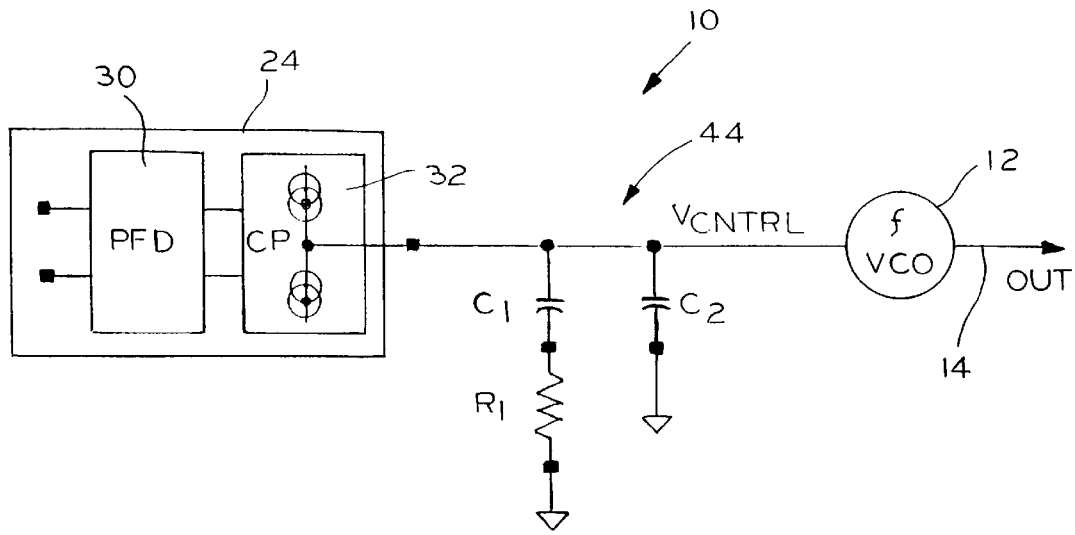
FIG. 3 is a block diagram illustrating a portion of the phase-locked loop circuit of FIG. 1 including a schematic with a prior art loop filter circuit.

Referring to FIG. 3, a portion of the phase-locked loop circuit 10 of FIG. 1 is illustrated utilizing a prior art loop filter circuit 44. The loop filter circuit 44 is a network consisting of a series-connected capacitor $C_1$ and resistor $R_1$ connected between the charge pump output and ground, and in parallel with a second capacitor $C_2$. As is known, if the value of the second capacitor $C_2$ is 0, then the loop filter 44 is second order. Otherwise, the loop filter is a third-order filter.

The value of the resistor $R_1$ has to be set such that a desired value for a damping factor is achieved. Typically, the damping factor is close to $1/\sqrt{2}$ of the critically damped case. If $R_1$ were chosen to be 0, then the loop would enter an undamped oscillation with the frequency of oscillation being the natural frequency of the loop, as is known.

While the resistor $R_1$ and the loop filter 44 is essential for stable loop dynamics, it gives rise to various disadvantages. The loop filter resistor $R_1$ creates a thermal noise voltage at the oscillator's control voltage input and thus modulates the phase of the VCO 12 in a random fashion. For small frequencies the loop filter's resistor noise is greatly attenuated. As frequency increases, the resistor's phase noise contribution increases. For large tuning sensitivities in small loop bandwidths, the contribution of the loop filter resistor $R_1$ for the overall output phase noise is significant. Particularly, the loop filter resistor $R_1$ dominates the overall phase noise in the neighborhood of the loop bandwidth.

A further disadvantage of the prior art loop filter 44 is that over time the supply voltage that supplies the phase-locked loop circuit 10 and the voltage-controlled oscillator 12 decreases. To keep the same frequency tuning range for the output signal with a lower available swing for the VCO control voltage requires that the tuning sensitivity of the VCO 12 be increased. This degrades the achievable phase noise. Thus it is harder to meet phase noise requirements for lower supply voltage implementations of the frequency synthesis blocks.

In accordance with the invention, the functionality of the resistor in a loop filter is implemented without adding the amount of noise that a resistor adds. This allows the same dynamics of a phase-locked loop circuit to be achieved while lowering phase noise. Particularly, it is desirable to lower the contribution of noise to the point where other noise sources in a loop dominate and ultimately limit the performance.

Figure 4:
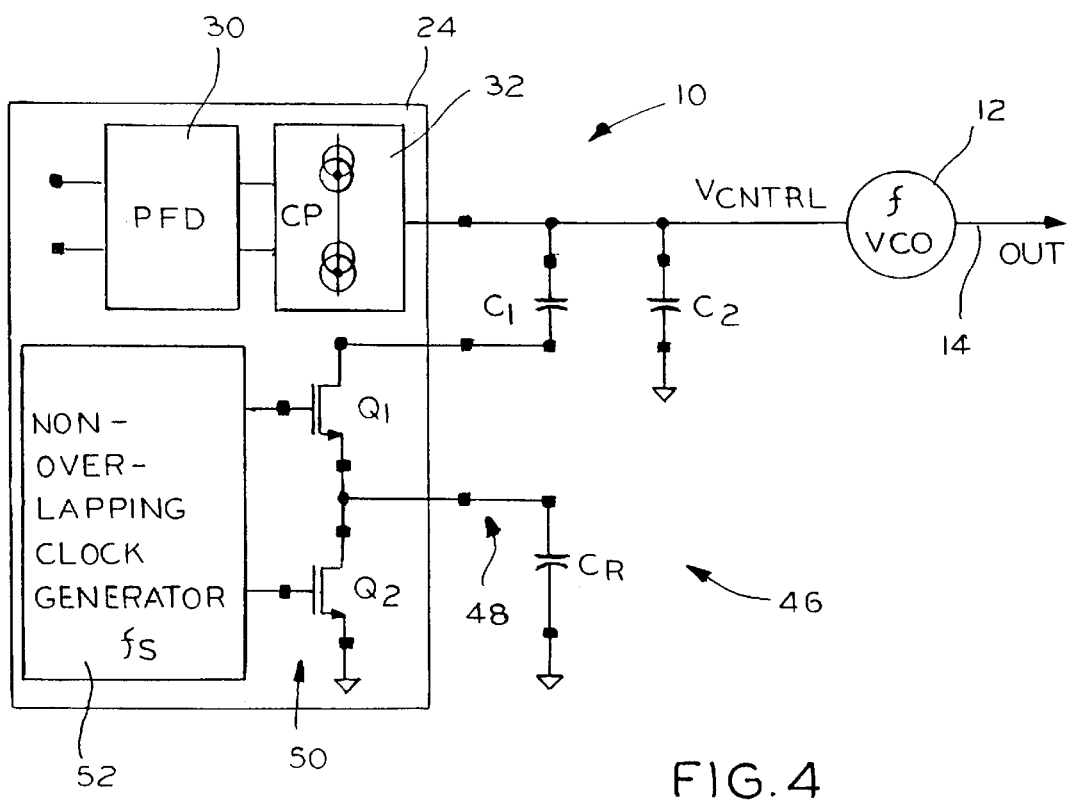
FIG. 4 is a block diagram illustrating a portion of the phase-locked loop circuit of FIG. 1 including a schematic with a loop filter circuit in accordance with the invention.

Referring to FIG. 4, a portion of the phase-locked loop circuit 10 of FIG. 1 is illustrated utilizing a loop filter 46 in accordance with the invention.

The loop filter circuit 46 uses the capacitors $C_1$ and $C_2$ as in FIG. 3. However, the resistor $R_1$ is replaced with a switched-capacitor equivalent resistor circuit 48. The circuit 48 includes a capacitor $C_R$ and a switching circuit 50.

The preferred application of the phase-locked loop circuit 10 is in conjunction with an application specific integrated circuit (ASIC). Nevertheless, the phase-locked loop circuit 10 could be used with other applications.

For a switched-capacitor equivalent generally, a capacitor C can be assumed to be connected to a source for the time $m*T$. The charge flowing to the capacitor will build up voltage Vacross it according to $Q=C*V$. Then, the capacitor is disconnected from the source and for the time $(1-m)*T$ the capacitor is discharged. Therefore, during the time T, the charge $Q=C*V$ is transferred out of the source. Hence, the average current is: $I=Q/T=V/(T/C)$ and the arrangement implements an equivalent resistor value of $$R = \frac{T}{C}$$

In order for the averaging to be accurate, it is necessary that the sampling frequency, namely $f_s=1/T$, is well above the frequency of the signal delivered by the source. Also, it is necessary that the capacitor can be fully discharged during the time $(1-m)*T$, otherwise the equivalent resistance differs from R=T/C. The equivalent resistor value does not depend on the switching duty cycle m.

The resistor implementation described above is only useful if the amount of noise generated by the circuit is below the noise level of the conventional resistor as shown in FIG. 3. For the time interval (1−m)*T, the capacitor is shorted and the rms-noise voltage across its terminals can be shown to be $v^2_{RMS}$=kT/C. At the time the switch is flipped to connect the capacitor to the source, the momentary noise voltage across the capacitor's terminals is sampled and will not change until the cycle starts again. Since it is necessary that the capacitor fully discharges during the time (1−m)*T, the sampling frequency $f_s$ does not fulfill the Nyquist criterion with respect to the bandwidth of the noise spectrum across the capacitor's terminals and strong aliasing will occur. Therefore, the entire noise power is being folded into the frequency range $-f_s/2 \leq f \leq f_s/2$ with the spectral density $kT/(f_s C)$. The spectrum of the sampled and held (for the time m*T) noise voltage is then (using $R=1/(f_s C)$):

$$\overline{v^2_{SH}(f)} = 4kTR \cdot \frac{m^2}{2} \cdot \text{sinc}^2\left(\pi m \frac{f}{f_s}\right).$$

Figure 5:
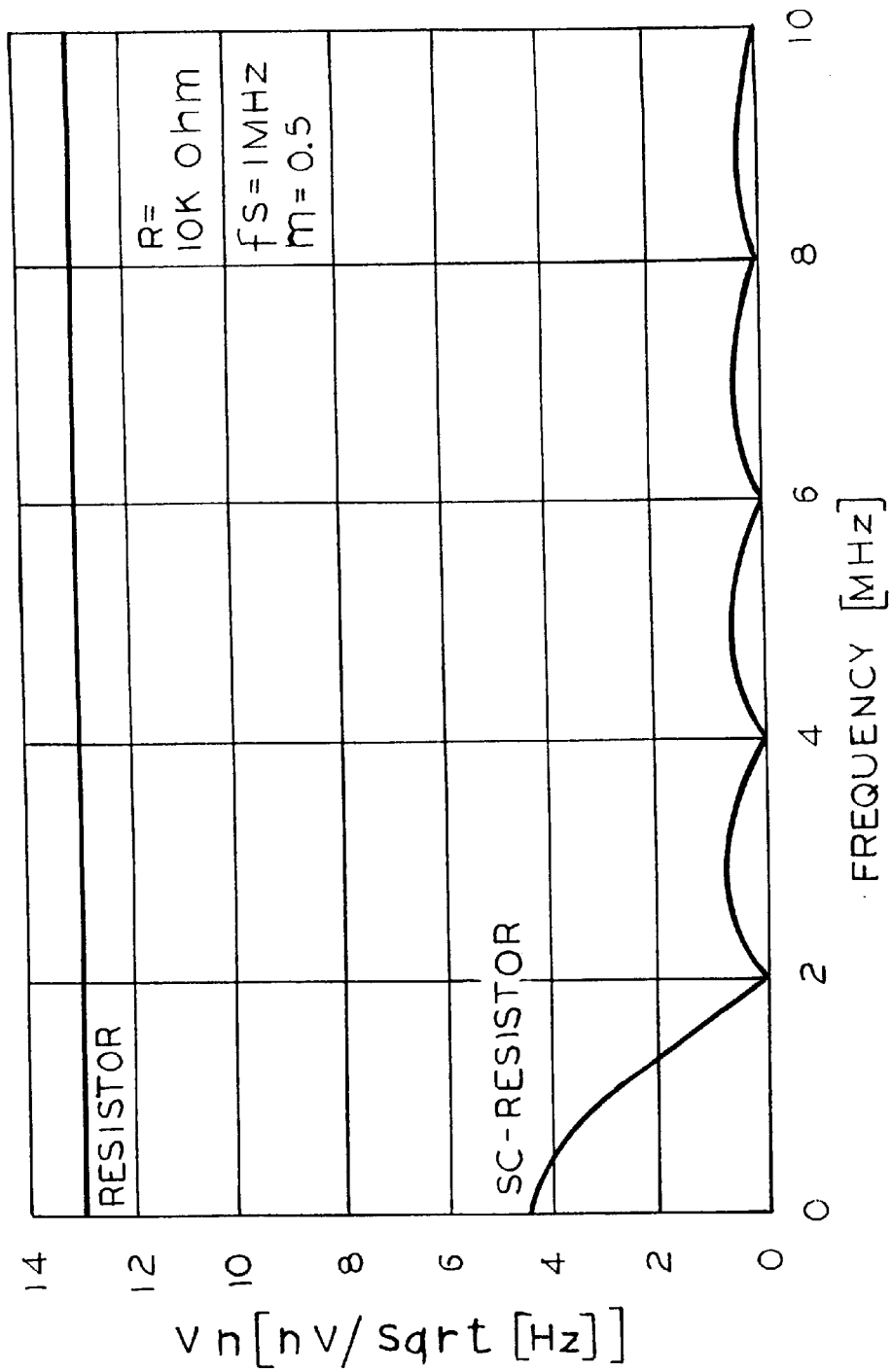
FIG. 5 is a curve illustrating spectral noise voltage density for a switched-capacitor resistor.

FIG. 5 shows the spectral noise voltage density for an equivalent 10 kΩ resistor, $f_s$=1 MHz and m=0.5.

The switching circuit 50 that connects the capacitor $C_R$ to the rest of the loop filter 46 or to ground is implemented via switches in the form of MOS transistors $Q_1$ and $Q_2$. The switches $Q_1$ and $Q_2$ are controlled by a non-overlapping clock generator 52 that is being driven by a signal source with frequency $f_s$ and a duty cycle m. The switching control is such that the first transistor $Q_1$ is on for the time $m/f_s$ and the second transistor $Q_2$ is on for the time $(1-m)/f_s$. If the switching frequency $f_s$ is chosen well above the loop bandwidth of the phase-locked loop circuit 10 and $C_R=1/(R_1 f_s)$, then the loop filter 46 is equivalent to the loop filter 44 shown in FIG. 3.

The capacitor $C_1$ is connected between the phase detector output and a collector of the transistor $Q_1$. The emitter of the first transistor $Q_1$ is connected to the collector of the second transistor $Q_2$. The emitter of the second transistor $Q_2$ is connected to ground. The capacitor $C_R$ is connected to the junction of the transistors $Q_1$ and $Q_2$ and to ground. The bases of the transistors $Q_1$ and $Q_2$ are connected to the non-overlapping clock generator 52.

The disclosed loop filter circuit 46 produces an equivalent resistor's phase noise contribution well below the total phase noise level as compared to the loop filter 44 of FIG. 3. As a result, other noise sources dominate the noise behavior of the loop.

While the loop filter 46 is disclosed in connection with a digital phase-lock loop circuit using a phase-frequency detector 30 and charge pump 32, the loop filter 46 could be used in connection with other types of phase detector implementations and phase-lock loop circuits, as is apparent.

Thus, in accordance with the invention, there is provided a phase-locked loop filter with a switch-capacitor resistor to improve phase noise characteristics of the output signal generated by the phase-locked loop circuit.

I claim:

1. A phase-locked loop circuit comprising:
   a voltage-controlled oscillator developing an oscillating output signal responsive to a voltage control input;
   a reference source providing a reference frequency signal;
   a phase detector operatively connected to the voltage-controlled oscillator and the reference source developing an output proportional to a phase difference between the oscillating output signal and the reference frequency signal;
   a loop filter connecting the phase detector output to the voltage control input, the loop filter comprising:
      a first shunt capacitor connected to the output of the phase detector;
      a switched capacitor; and
      a switching circuit to alternately connect said switched capacitor in series to the first shunt capacitor when the switching circuit is in a first state and to ground when the switching circuit is in a second state such that the switched capacitor functions as a resistive element in said loop filter.

2. The phase-locked loop circuit of claim 1 wherein the loop filter further comprises a second shunt capacitor connected between the phase detector output and ground.

3. The phase-locked loop circuit of claim 1 wherein the switching circuit comprises a first transistor connecting the capacitor to the first shunt capacitor and a second transistor connecting the capacitor to ground.

4. The phase-locked loop circuit of claim 1 wherein the phase detector comprises a phase frequency detector.

5. The phase-locked loop circuit of claim 1 wherein the phase detector includes a charge pump circuit and the loop filter converts current pulses from the charge pump circuit into a voltage at the voltage control input.

6. The phase-locked loop circuit of claim 5 wherein the phase detector includes a pair of edge-triggered resettable flip-flops and the oscillating output signal and the reference frequency signal are clock signals for the flip-flops and the flip-flops drive the charge pump circuit.

7. The phase-locked loop circuit of claim 1 further comprising dividers connecting the oscillating output signal and the reference frequency signal to the phase detector.

8. The phase-locked loop of claim 1 wherein the output of the phase detector comprises a series of pulses and wherein the loop filter functions as an integrator to convert the pulses output by the detector into a voltage control input.

9. A phase-locked loop circuit comprising:
   a voltage-controlled oscillator developing an oscillating output signal responsive to a voltage control input,
   a reference source providing a reference frequency signal;
   a phase detector operatively connected to the voltage-controlled oscillator and the reference source developing an output proportional to a phase difference between the oscillating output signal and the reference frequency signal;
   a loop filter connecting the phase detector output to the voltage control input, the loop filter comprising:
      a first shunt capacitor connected to the output of the phase detector;
      a switched capacitor; and
      a switching circuit to alternatively connect said switched capacitor in series to the first shunt capacitor when the switching circuit is in a first state and to ground when the switching circuit is in a second state such that the switched capacitor functions as a resistive element in said loop filter, said switching circuit comprising a non-overlapping clock generator circuit.

10. The phase-locked loop circuit of claim 9 wherein the clock generator circuit operates at a frequency above a loop bandwidth of the phase-locked loop circuit.

11. A method of reducing thermal noise in a phase-locked loop including a voltage controlled oscillator generating an output signal and a phase detector generating a voltage control input for the voltage controlled oscillator, said method comprising:

connecting a first shunt capacitor between the output of the phase dtector and the voltage-controlled oscillator;

connecting a switching circuit between said first shunt capacitor and ground; and alternately connecting a switched capaictor in series to the first shunt capacitor and to ground such that the switched capacitor functions as a resisitve element.

12. The method of claim 11 wherein alternately connecting the switched capacitor in series to the first shunt capacitor and to ground comprises:

closing a first switch in said switching circuit, during a first switching phase to connect said switched capacitor in series to the shunt capacitor; and closing a second switch, in said switching circuit, during a second switching phase to connect said switched capacitor to ground.

13. The method of claim 12 wherein said first and second switching phases are non-overlapping.

14. The method of claim 13 wherein a switching frequency of said first and second switches is greater than the loop bandwidth of the phase-locked loop.

15. The phase-locked loop of claim 11 wherein the output of the phase detector comprises a series of pulses and further comprising the step of integrating the output of the phase-detector to generate a voltage control input.

* * * * *